United States Patent [19]
Merrill

[11] Patent Number: 5,239,440
[45] Date of Patent: Aug. 24, 1993

[54] ELECTROSTATIC DISCHARGE PROTECTION FOR INTEGRATED CIRCUITS

[75] Inventor: Richard B. Merrill, Daly City, Calif.

[73] Assignee: National Semiconductor Corporation, Santa Clara, Calif.

[21] Appl. No.: 930,492

[22] Filed: Aug. 14, 1992

Related U.S. Application Data

[63] Continuation of Ser. No. 452,879, Dec. 19, 1989, abandoned.

[51] Int. Cl.$^5$ .......................... H02H 9/04; H02H 3/22
[52] U.S. Cl. .......................................... 361/91; 361/56
[58] Field of Search .................... 361/56, 58, 91, 98, 361/111; 357/23.13

[56] References Cited

U.S. PATENT DOCUMENTS 4,870,530 9/1989 Hurst ...................................... 361/91

OTHER PUBLICATIONS

Q. Say, "Resistorless ESD Protection Device for High Speed CMOS Circuits," *Proc. of the IEEE 1988 Custom Integrated Circuits Conf.*, May 1988, pp. 27.2.1–27.2.4.
L. R. Avery, "ESD and the Effects on Integrated Circuit Reliability," *New Electronics, Incorporating Electronics Today* (Apr. 1985) 18(8):151–153.

*Primary Examiner*—Steven L. Stephan
*Assistant Examiner*—D. R. Haszko
*Attorney, Agent, or Firm*—Townsend and Townsend Khourie and Crew

[57] ABSTRACT

A circuit is disclosed for protecting an integrated circuit or another circuit from damage due to electrostatic discharge. The protection circuit includes a triggering circuit and a clamping circuit. In response to an electrostatic discharge, the triggering circuit turns on the clamping circuit to clamp a node of the protected circuit to both an upper and a lower potential. This allows the electrostatic discharge to dissipate harmlessly to either potential source, depending upon its polarity. Preferably, the triggering circuit consists of a resistor-capacitor network which generates the required control signal every time power is supplied to the circuit being protected, while the clamping circuit consists of a pair of transistors for connecting an input pin to both the high and low potential sources. Typically, one protection circuit is coupled to each input/output pin of the integrated circuit being protected.

13 Claims, 5 Drawing Sheets

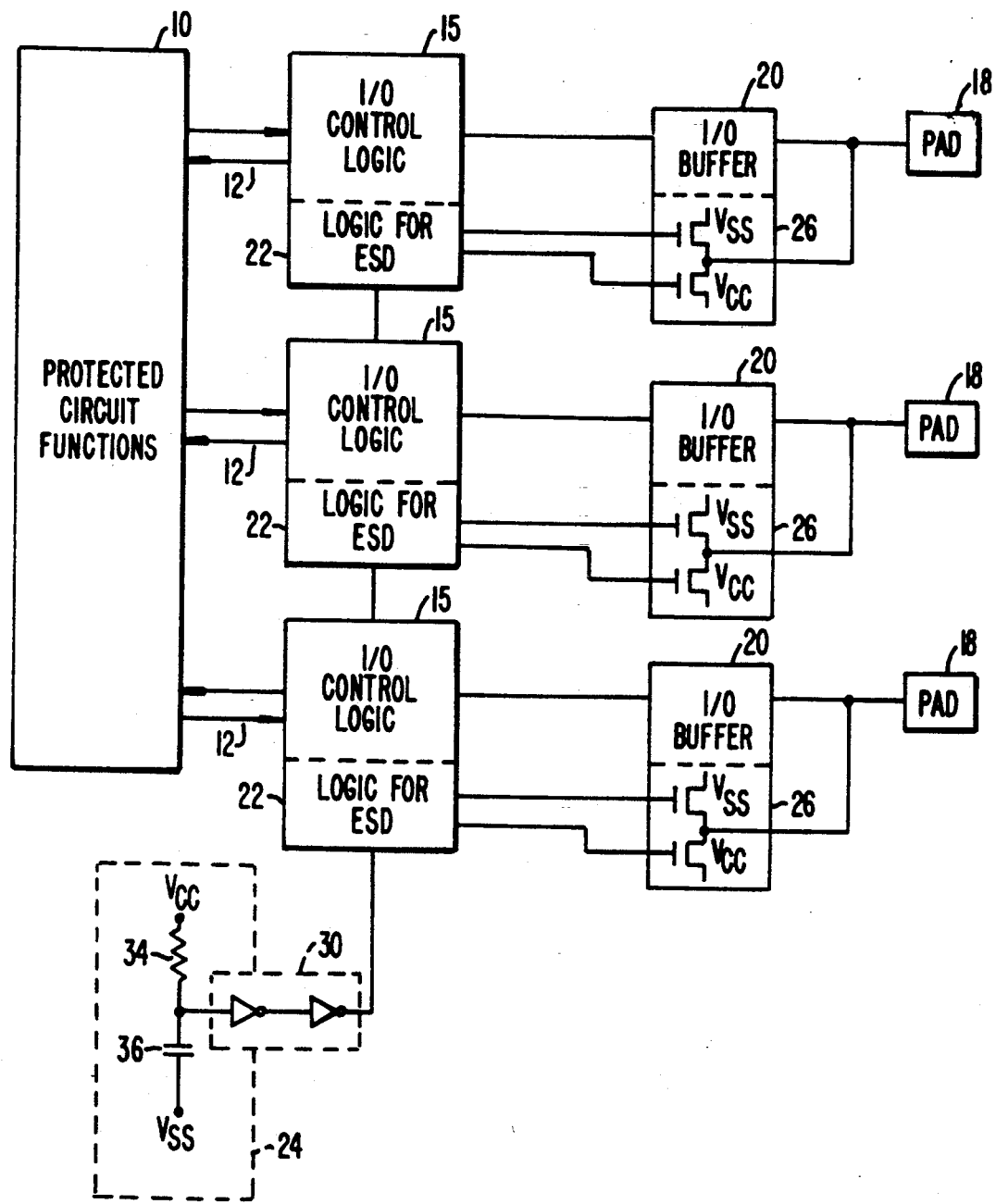
FIG._1.

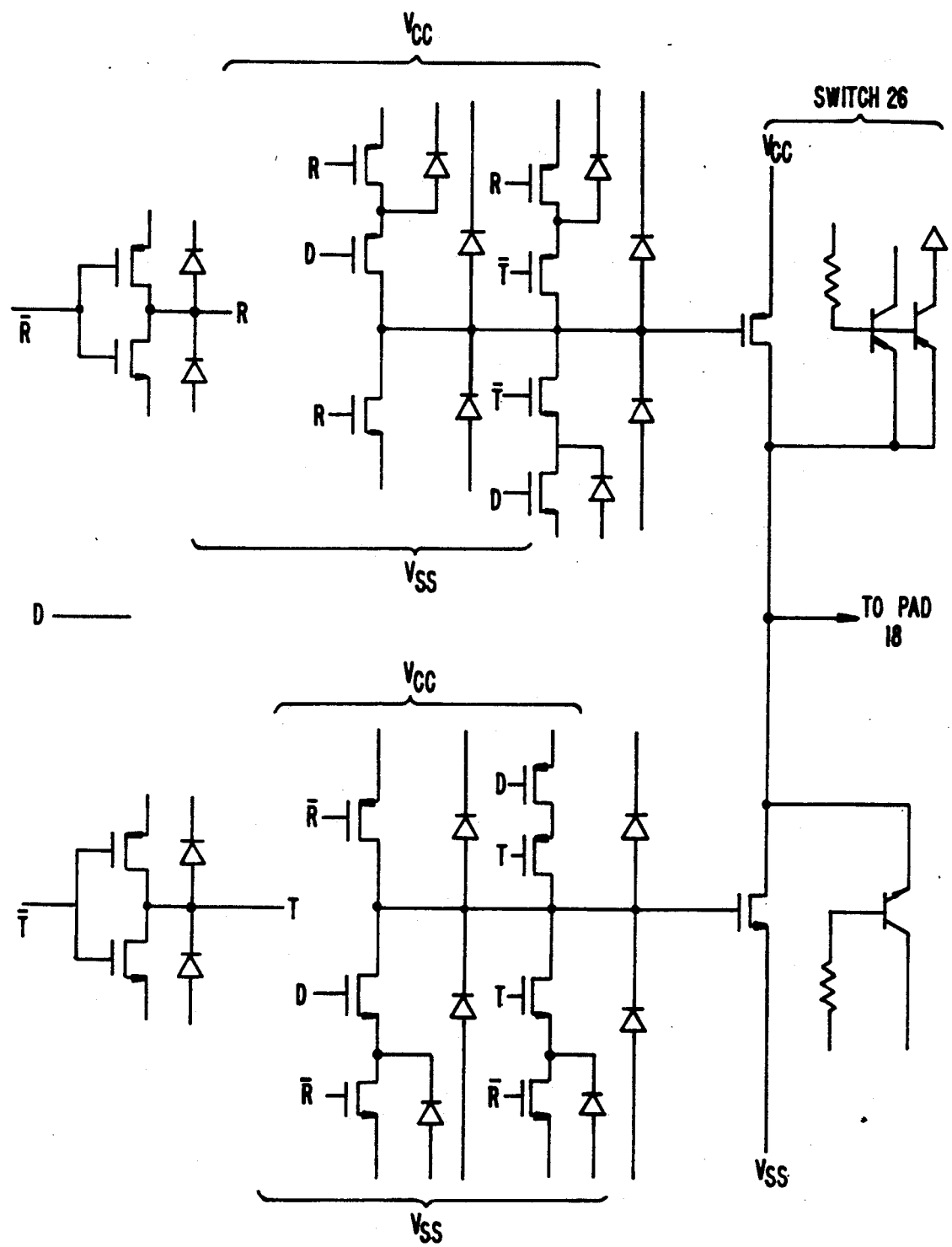
FIG_2.

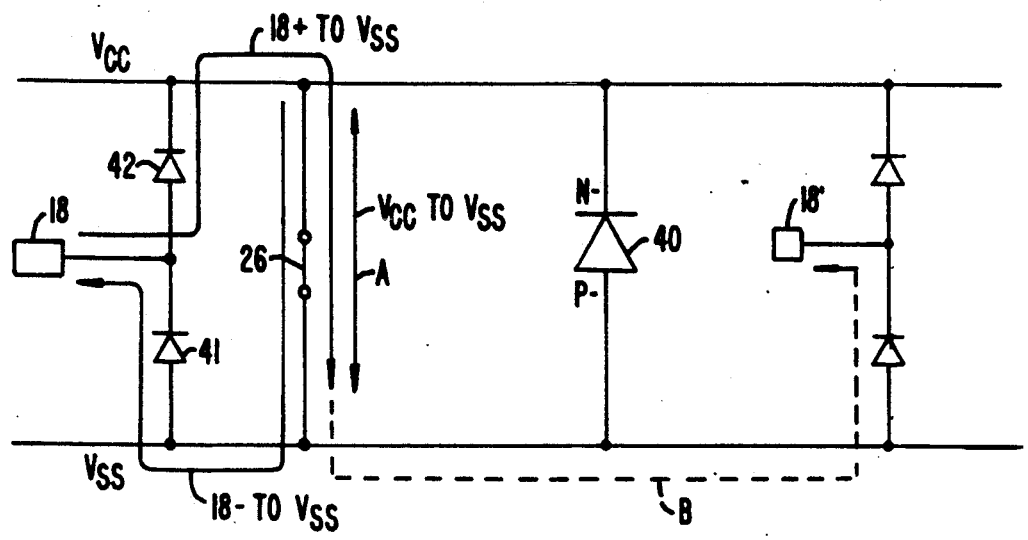
FIG._3.
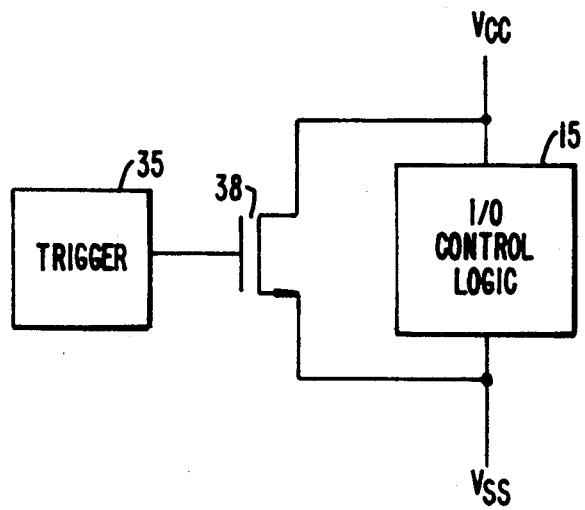
FIG._4.
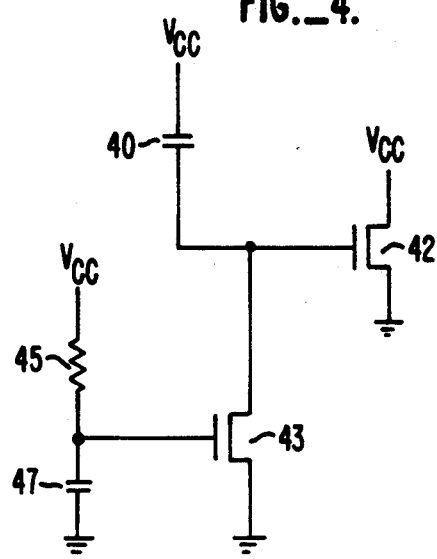
FIG._5.

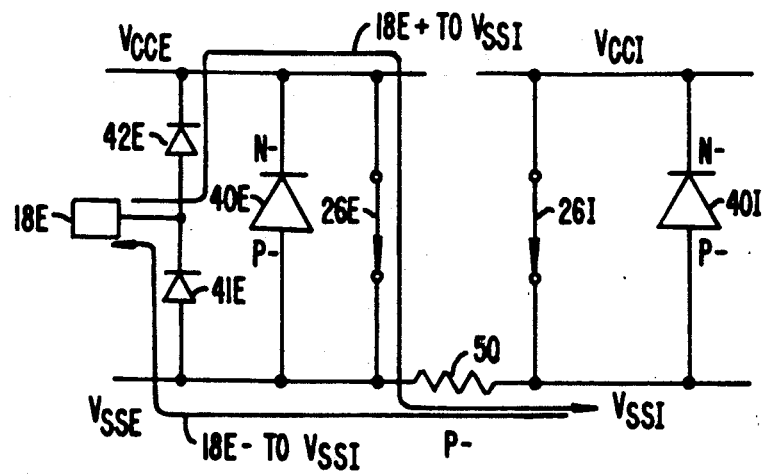
FIG._6A.
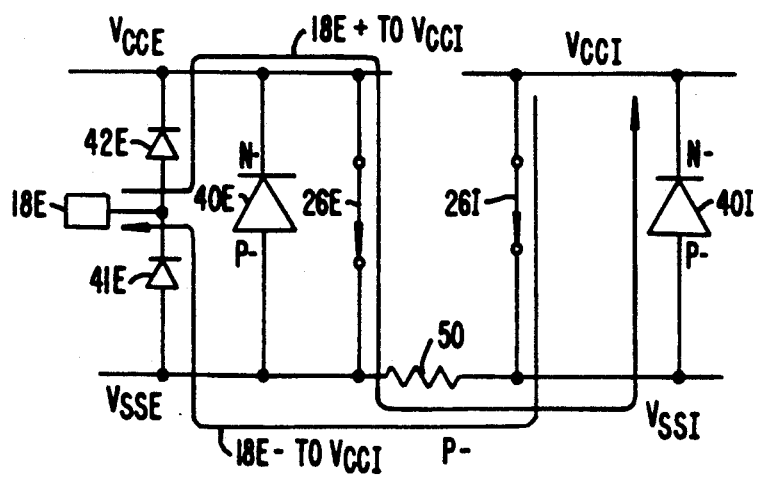
FIG._6B.
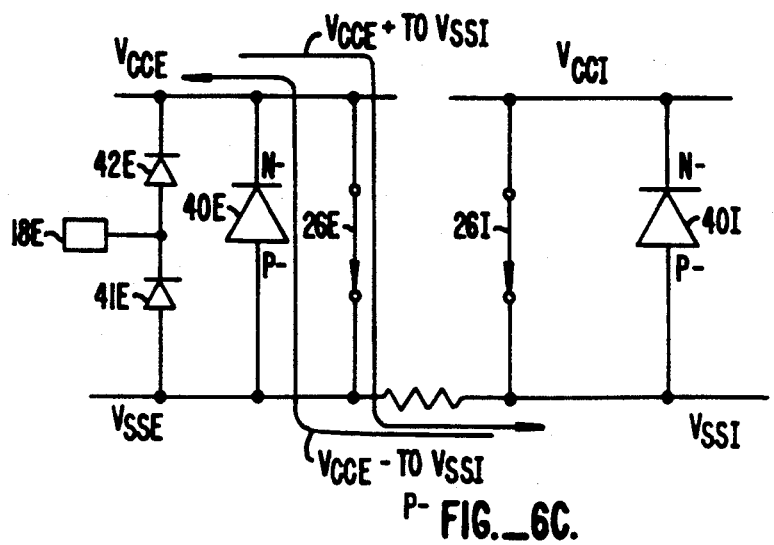
FIG._6C.

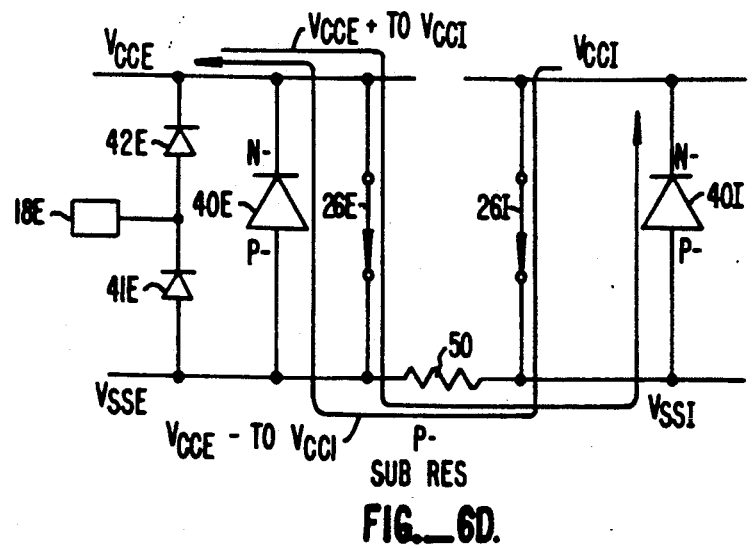
FIG._6D.
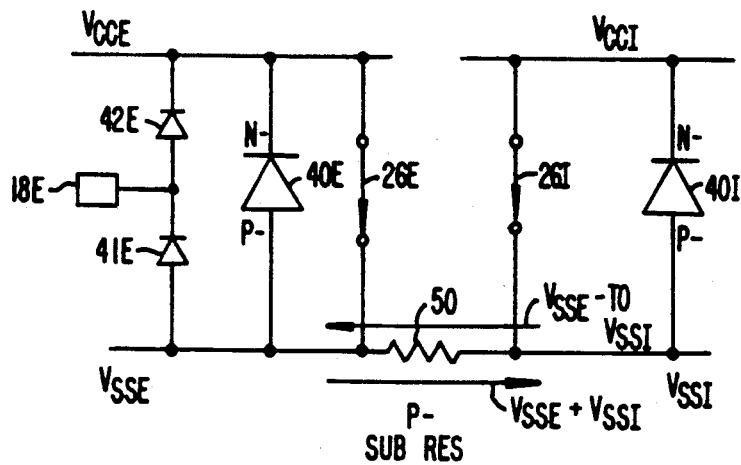
FIG._6E.
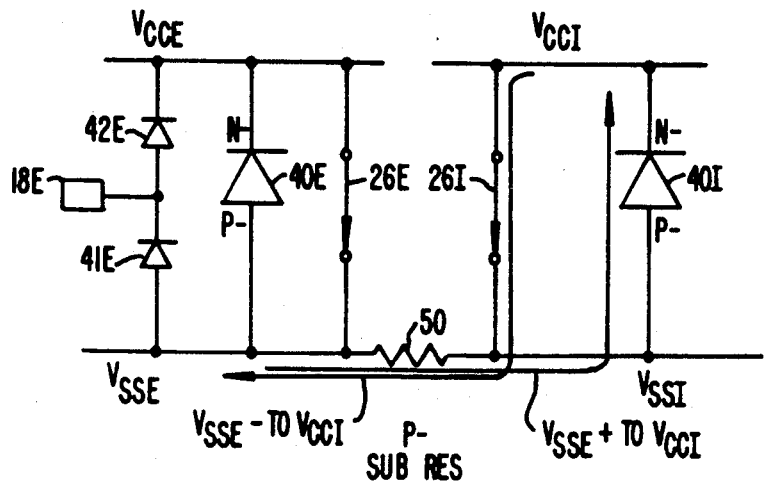
FIG._6F.

ELECTROSTATIC DISCHARGE PROTECTION FOR INTEGRATED CIRCUITS

This is a continuation of application Ser. No. 07/452,879 filed Dec. 19, 1989, now abandoned.

BACKGROUND OF THE INVENTION

1. Field of the Invention

This invention relates to electrostatic discharge protection circuits. More particularly, the invention relates to an electrostatic discharge protection circuit used to protect field effect transistor circuits, especially those with features of one micron or smaller.

2. Description of the Prior Art

Integrated circuits employing field effect devices, commonly termed MOS integrated circuits, have a history of susceptibility to electrostatic discharge. Given the decreasing size of circuit features with everimproving process technology, static electricity generated by daily activity alone can destroy or substantially harm many MOS circuits. The circuits most susceptible to damage are usually finished circuits which have been packaged, but not yet installed into a finished product. Once installed, other means can protect the chip from damage.

An electrostatic discharge typically occurs when the circuit is touched by an individual handling the circuit before installation; when a static discharge occurs as the packaged circuit slides on its pins across another surface; or more generally, whenever the circuit is exposed to static electricity. Overall, damage from electrostatic discharges is the cause of over half of the devices returned by customers.

One traditional method for protecting integrated circuit devices employing field effect transistors from electrostatic discharge is to use diodes. These diodes are coupled between the input paths of the circuit and the pins to which the power supplies are connected. With electrostatic discharge events of one polarity the diodes are forward-biased, and with discharges of the opposite polarity they are reverse-biased. Normally the discharge that causes the diodes to become reverse-biased is the more problematic, because voltages and power surges seen by the internal logic circuits are higher than for the forward-biased case. Other methods used for protecting MOS circuits from electrostatic discharge damage are almost always variations on the diode clamping system described above.

The traditional methods described above usually function satisfactorily for circuits with large features. As the features of integrated circuits, however, approach one micron and smaller, lower voltages than those which damage larger features can destroy the diodes and the circuit. A more serious problem with double diode clamps is that they are not readily subject to analysis by circuit simulation software. In other words, it has typically been a "hit or miss" approach with double diode clamps to protect circuits from electrostatic discharge. This hit or miss approach inhibits and delays product development, adding trial and error design cycles to product release.

Another complication with electrostatic discharge problems is the increasingly higher customer standards in device reliability and performance. The military, in particular, by imposing standards such as Military Standard 883C have significantly increased the product performance standard over the old standard. This has the acceptability of previous electrostatic discharge protection techniques.

SUMMARY OF THE INVENTION

This invention provides electrostatic discharge protection circuitry that allows circuit fabrication and analysis using common methods. In particular, the technique of this invention provides a low impedance switch which dissipates static electricity, yet is transparent to normal circuit operation. The circuit of the preferred embodiment satisfies military specifications, and is capable of protecting the newest substantially decreased feature sizes of MOS integrated circuits, not heretofore possible. The invention also protects integrated circuits prior to their installation on circuit boards.

The invention provides a switch between the power supplies driving the integrated circuit, typically Vcc and Vss, that is turned on only during the electrostatic discharge event. Using this technique, an electrostatic discharge event of polarity that would normally reverse-bias the circuits input diodes now can be shunted through forward-biased diodes and a short circuit between Vss and Vcc.

Additionally, electrostatic discharge events of a polarity that tended to reverse-bias the input diodes tends to supply power to Vcc/Vss. This invention makes use of the effect to provide power to the logic that controls the low impedance Vcc/Vss switch.

In the cases of discharges during handling or when not in place on a printed circuit board, the discharge will power up the circuit causing the logic circuit to operate to turn on the clamp. The clamp then allows the electrostatic charge to dissipate through whatever material contacts the circuit pins.

The electrostatic discharge protection circuit of a preferred embodiment is easily fabricated on a chip using well known fabrication processes. The circuit is small, and therefore integrates easily onto an integrated circuit chip with the normal circuitry otherwise present. Importantly, the protection circuit is transparent to the protected circuit's normal operation.

BRIEF DESCRIPTION OF THE DRAWINGS

FIG. 1 is a block diagram of a preferred embodiment of the electrostatic discharge protection circuit illustrating its relationship with a circuit being protected.

FIG. 2 illustrates a typical circuit employed to activate the electrostatic discharge protection circuit.

FIG. 3 illustrates the current paths for various discharge polarities between a pin or pins and power supplies.

FIG. 4 illustrates an alternative embodiment of the electrostatic discharge protection circuit.

FIG. 5 illustrates a further alternative electrostatic discharge protection circuit.

FIGS. 6A to 6F depict current paths for discharge polarities in multiple supply circumstances.

DETAILED DESCRIPTION OF THE PREFERRED EMBODIMENTS

FIG. 1 illustrates a preferred embodiment of the electrostatic discharge protection circuit in block form as employed to protect another circuit. As shown in FIG. 1, a protected circuit 10 has a series of input/output nodes 12. For simplicity, only three such nodes are shown in the figure; however, it should be understood that in a typical embodiment there may be hundreds of such nodes. The protected circuit can have any function, but typically will be a digital logic circuit such as a gate array or the like. Data, addresses, and other signals destined for the protected circuit are received at bonding pads 18, typically positioned around the periphery of an integrated circuit on which all of the circuitry of FIG. 1 is formed. These signals then are supplied to input/output buffers 20 and to input/output control logic 15 before reaching the protected circuit. Of course, in a similar manner, signals originating within the protected circuit, which are destined for circuits outside the integrated circuit being protected, are supplied from the protected circuit through the control logic 15 and buffers 20 to bonding pads 18.

Importantly, in addition to the conventional circuitry described, the circuit shown in FIG. 1 includes some additional logic 22 for controlling or "triggering" the electrostatic discharge protection circuit 24, 30. This is described below.

The electrostatic discharge circuit provides a clamp 26 which also acts as a switch, that is, by appropriate means, such as logic 22 turned on between Vcc and Vss, during an electrostatic discharge event. This results in the electrostatic discharge event being discharged in a direction that would normally reverse-bias the input diodes, the worst case in prior art devices. The event thus is shunted through the forward-biased diodes and the short between Vss and Vcc. Because an electrostatic discharge event in the direction that tends to reverse-bias the traditional input diodes is of a polarity that tends to power up Vcc and Vss, this circuit helps provide power to the logic 22 that controls the low impedance switch.

In essence, the trigger circuit 24 shown in FIG. 1 controls the clamps 26 to short Vcc to Vss, or power to ground, whenever an electrostatic discharge event occurs. By adjusting the values of the resistor and capacitor components of the trigger, shorter or longer periods may be employed. In the preferred embodiment, logic circuit 22 is connected through a buffer 30 to the resistor-capacitor circuit 24. Buffer circuit 30 steps the voltage up from the RC circuit before it is applied to the logic circuit 22. The capacitor 36 of the trigger circuit is connected to Vss, while the resistor 34 is connected to Vcc.

In operation, the protection circuit uses some of the voltage from the accumulating static electricity to enable the logic 22 to turn on the clamp 26 to dissipate the excess voltage. Because an electrostatic discharge event occurs much faster than 1 microsecond, the RC bypass circuit 24 is set so that the circuit time constant of resistor 34 and capacitor 36 are such that the low impedance switch is on for a period of time in excess of the electrostatic discharge event. A preferred time constant is about 1 microsecond, because it is slow enough to allow the discharge to power the logic circuit and enable the complementary transistors int eh low impedance switch.

The RC bypass circuit 24 is designed not to trigger during normal power supply ramp-up. This is achieved by setting the RC time constant greater than the ESD time constant and less than the circuit board's regular power supply rise time.

Placing the clamp 26 in the I/O buffer 20, while placing the inverter at the logic output, effectively shields the logic circuit from static electricity damage, yet allows the logic circuit 15 to function normally.

FIG. 2 is a schematic diagram illustrating the extra logic added in block 22 of FIG. 1 to provide electrostatic discharge protection. The circuit shown in FIG. 2 receives three input signals, a reset signal $\overline{R}$ from circuit 24, a data signal D and a signal $\overline{T}$. Under normal protected circuit conditions only D and T are active. In the event of an electrostatic discharge, however, $\overline{R}$ will go to a low voltage to turn on the low impedance switch 26 on the right-hand side of the circuit. The low impedance switch connects Vcc to Vss, discharging the electrostatic event.

FIG. 3 is a diagram illustrating the discharge paths for several different electrostatic conditions. The circuit of FIG. 3 includes a Vcc rail and a Vss rail. The clamp circuit 26 described in conjunction with FIG. 1 is illustrated as a switch 26' in FIG. 3.

To explain the discharge paths, switch 26' is shown in a closed position as it would be after triggering by an electrostatic event. The diodes 41 and 42 shown in the figure are the input diodes associated with each bonding pad, while the large diode 40 represents the diode formed by the N conductivity type wells and P conductivity type substrate in a typical CMOS semiconductor structure. As shown by the path designated A, if either Vcc or Vss is charged positively with respect to the other, the discharge would be dissipated through the switch to the other rail.

On the other hand, if the electrostatic discharge causes Vcc to be biased positively with respect to the bonding pad 18, the discharge will flow through switch 26' and then through diode 41 to bonding pad 18. If pad 18 is biased more positive than Vss, then the discharge is dissipated through a path from the bonding pad through diode 42, and thensthrough switch 26' to Vss.

Also illustrated in FIG. 3 is the pad-to-pad discharge path. If bonding pad 18 is biased by the electrostatic discharge event more positively than pad 18', then the charge will be dissipated along path B. If pad 18' is positive compared to pad 18, then the charge will be dissipated in a corresponding manner.

FIG. 4 is an alternative embodiment in which the control logic 15 is protected by a trigger circuit 35 driving a single large transistor 38, instead of the clamp discussed above. The source and drain of the transistor are coupled between Vcc and Vss. During an electrostatic event, the trigger is activated, turning on transistor 38 for a short time to dissipate the excess charge to the power supply, regardless of the polarity of the discharge. Trigger 35 can employ any standard triggering technique. For example, in one embodiment it is activated each time the circuit is turned on by using an RC network such as network 24 in FIG. 1.

A further embodiment of our invention is shown in FIG. 5, illustrating a different trigger circuit. As shown therein, a capacitor 40 is connected between Vcc and a field effect transistor 42. The gate of field effect transistor 42 is, in turn, connected to another field effect transistor 43, while the source and drain are connected between Vcc and ground. Transistor 43 is connected between the gate of transistor 42 and ground, with the gate of transistor 43 being coupled to an RC network formed by resistor 45 and capacitor 47.

In operation, a voltage spike or discharge on Vcc will charge capacitor 40 turning on transistor 42 to short Vcc to ground whenever a spike occurs. The RC network has a time constant of about 2 microseconds and prevents Vcc from being connected to Vss (not shown) except during power up or during a pulse on Vcc. In the preferred embodiment, capacitor 40 and 47 will each be about 2 picofarads, and resistor 45 will be about 1 megohm.

FIGS. 6A–6F illustrate current paths for discharges of various polarities in a multiple pin circumstance. For an integrated circuit to comply with military standards, it must be capable of dissipating an electrostatic charge of any polarity applied to any one of the multiple power supplies used to drive a circuit. The dissipation of charge in these circumstances is shown in FIGS. 6A–6F. Each of the figures depicts the input diodes, the substrate N-well diode, and the clamp circuit described in conjunction with earlier figures herein. Corresponding components have been given the same reference numeral in each figure. Each figure also shows the circuitry for each of two pins--pin E and pin I, each pin driven by different power supplies. All pins on an integrated circuit are effectively connected together through a substrate resistance, and this resistance is represented by a resistor 50 shown between the electrostatic discharge protection circuit for pin E and the circuit for pin I.

In FIG. 6A two electrostatic discharge current paths are depicted. The first current path shows current flow for a circumstance in which the input pin 18E is biased positively with respect to VssI. In this circumstance, the current flow through the upper diode 42E to VccE, then through clamp 26E and substrate resistor 50 to VssI. As also shown in FIG. 6A, if instead VssI is biased negatively with respect to VssI, then current flow is through resistor 50 and lower diode 41E to pad 18E.

FIG. 6B illustrates two current paths for circumstances in which the input pin is biased positively and negatively with respect to VccI of another pin on the circuit. In the case in which the input pin 18E is biased positively with respect to VccI, then current flow is through the upper diode 42E, the low impedance switch 26E, the substrate resistor 50, and finally diode 40I to VccI. For the circumstance in which VccI is biased more positively than the input pin 18E, then current flow is through switch 26I, substrate resistor 50, and lower diode 41E to pad 18E.

FIG. 6C depicts the circumstances in which VccE is biased positively and negatively with respect to VssI. In the case of Vcc being more positive than VssI, the current flow is through switch 26E in substrate resistor 50 to VssI. In the other circumstance, current flows from VssI through the diode 40E to VccE.

FIG. 6D illustrates circumstances in which VccE and VccI are biased with by the electrostatic event opposite polarities. As shown, the current paths are symmetrical. When VccI is biased more positively than VccE, current flows through switch 26I, through substrate resistor 50 and through diode 40E to VccE. If VccE is more positive than VccI, current flows in the opposite direction through switch 26E and diode 40I.

FIG. 6E illustrates a simple case in which VssE and VssI are biased by the electrostatic event with respect to each other. As shown, current simply flows from the more positively biased to the less positively biased through the substrate resistor 50.

FIG. 6F illustrates the circumstance in which VccI and VssE are biased with respect to each other. In this case, current flowing from VccI passes through switch 26I and resistor 50. Current flowing in the opposite direction flows through resistor 50 and diode 40I.

The techniques described herein were tested to assure their compliance with Military Standard 883C. In one test various components were manufactured in a manner which allowed the electrostatic discharge techniques described herein to be selectively enabled and disabled. Each part was "zapped" at 3 KeV in accordance with the military specification on a IMCS 3000 ESD tester. All parts passed the test with the protection circuit enabled, and all failed with the circuit disabled.

An important advantage of all of the alternative embodiments described above is their ability to be simulated using conventional circuit simulation techniques. Prior art techniques for protecting circuits from electrostatic discharge were difficult to simulate, and consequently circuits employing them often required modification after fabrication of an integrated circuit employing them. Of course, making significant changes to an integrated circuit after its initial fabrication is extremely expensive and time consuming, often delaying shipment of the protected product for a considerable period. Such delays are highly disadvantageous. In addition, circuits employing the protective techniques described herein satisfy military specifications. According to one military specification, no damage to a circuit must occur if any or all pins are zapped to each of power and ground, and also with respect to other pins.

Although the foregoing has been a description of the preferred embodiment of the invention, it will be obvious to those of skill in the art that variations may be made without departing from the scope of the invention. For example, although in the preferred embodiment the protected circuit, the logic circuit implementing the electrostatic protection and the clamp circuit have all been described as employing field effect transistors, bipolar transistors may be used instead. The scope of the invention is set forth in the appended claims.

We claim:

1. A protection circuit for protecting a functional circuit from electrostatic discharge, the functional circuit having a power supply with a first potential, a low potential source with a potential lower than the first potential, and an input node connected between the power supply and the low potential source, the protection circuit comprising:
   a first node connected between the power supply and the input node;
   a second node connected between the low potential source and the input node;
   triggering means for generating a control signal in response to an electrostatic discharge; and
   switch means connected to the triggering means for switchably connecting the first node to the second node in response to the control signal.

2. A protection circuit as in claim 1 wherein the switch means comprises:
   a first transistor connected between the input node of the functional circuit and the first node, and
   a second transistor connected between the input node and the second node.

3. A protection circuit as in claim 2 wherein each of the first and second transistors is connected to receive the control signal and in response connected to input node to the corresponding first and second nodes.

4. A protection circuit as in claim 3 wherein each of the first and second transistors comprises a field effect transistor.

5. A protection circuit as in claim 1 wherein the triggering means comprises a resistor-capacitor network for triggering the switch means whenever an electrostatic discharge event occurs.

6. A protection circuit as in claim 5 wherein the resistor-capacitor network comprises a serially connected resistor and capacitor between the first node and the second node.

7. A protection circuit as in claim 6 wherein the resistor-capacitor network is chosen to have a time constant greater than the duration of the electrostatic discharge.

8. A protection circuit as in claim 1 wherein the switch means comprises a single transistor connected to the first node and the second node.

9. A protection circuit as in claim 8 wherein the single transistor comprises a field effect transistor having a control electrode connected to the trigger circuit.

10. A protection circuit as in claim 1 wherein the triggering circuit comprises:
   a transistor connected between the first node and the second node, whereby an electrostatic discharge on the first node will turn on the transistor to connect the first node to ground.

11. An integrated circuit protected from electrostatic discharge comprising:
   a functional circuit having a plurality of connection nodes for performing operations in response to signals supplied to the connection nodes, the functional circuit having a power supply with a first potential, a low potential source with a potential lower than the first potential, and at least a first connection node connected to the power supply and a second connection node connected to the low potential source;
   a plurality of switch means, one connected to each of the corresponding ones of the plurality of connection nodes, each switch means for connecting that connection node to both the first and second connection nodes in response to a control signal; and
   a triggering circuit for generating the control signal in response to an electrostatic discharge.

12. A protection circuit as in claim 11 wherein the triggering circuit also generates the control signal for a short time each time power is applied to the functional circuit is powered up.

13. An integrated circuit as in claim 12 wherein the triggering circuit is also connected between the first and second connection node.

* * * * *

UNITED STATES PATENT AND TRADEMARK OFFICE
CERTIFICATE OF CORRECTION

PATENT NO. : 5,239,440 Page 1 of 1
APPLICATION NO. : 07/930492
DATED : August 24, 1993
INVENTOR(S) : Richard B. Merrill It is certified that error appears in the above-identified patent and that said Letters Patent is hereby corrected as shown below:

In Column 6, line 60, "connected to" should be --connects the--.

In Column 7, line 13, "trigger circuit" should be --triggering means--.

In Column 7, line 15, "circuit" should be --means--.

Signed and Sealed this

Eighteenth Day of December, 2007

JON W. DUDAS
*Director of the United States Patent and Trademark Office*